US009916896B1

(12) United States Patent
Arsovski et al.

(10) Patent No.: US 9,916,896 B1
(45) Date of Patent: Mar. 13, 2018

(54) TERNARY CONTENT ADDRESSABLE MEMORY (TCAM) FOR MULTI BIT MISS DETECT CIRCUIT

(71) Applicant: GLOBALFOUNDRIES INC., Grand Cayman (KY)

(72) Inventors: Igor Arsovski, Williston, VT (US); Robert M. Houle, Williston, VT (US); Michael T. Fragano, Essex Junction, VT (US); Akhilesh Patil, South Burlington, VT (US); Van D. Butler, South Burlington, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/340,579

(22) Filed: Nov. 1, 2016

(51) Int. Cl.
*G11C 7/00* (2006.01)
*G11C 15/04* (2006.01)
*G11C 29/12* (2006.01)

(52) U.S. Cl.
CPC .............. *G11C 15/04* (2013.01); *G11C 29/12* (2013.01); *G11C 2029/1204* (2013.01)

(58) Field of Classification Search
CPC ..... G11C 7/1048; G11C 7/12; G11C 11/4094; G11C 11/4091; G11C 7/22
USPC ............................................. 365/203, 49.17
See application file for complete search history.

(56) References Cited

U.S. PATENT DOCUMENTS

| 7,006,368 | B2 | 2/2006 | Arsovski et al. | |
|---|---|---|---|---|
| 7,800,930 | B1 * | 9/2010 | Deshpande | G11C 15/04 365/203 |
| 8,913,412 | B1 * | 12/2014 | Khanna | G11C 15/04 365/49.17 |
| 2006/0104100 | A1 | 5/2006 | Arsovski et al. | |

OTHER PUBLICATIONS

Y. Tsukamoto et al, "1.8 Mbit/mm2 Ternary-CAM macro with 484 ps Search Access Time in 16 nm Fin-FET Bulk CMOS Technology", IEEE Symposium VLSI Circuits, 2015, 2 pages.
I. Arsovski et al, "A 32 nm 0.58-fJ/Bit/Search 1-GHz Ternary Content Addressable Memory Compiler Using Silicon-Aware Early-Predict Late-Correct Sensing With Embedded Deep-Trench Capacitor Noise Mitigation," IEEE Journal of Solid-State Circuits, Apr. 2013, vol. 48, 8 pages.
K. Nii et al., "A 28nm 400MHz 4-parallel 1.6 G search/s 80Mb ternary CAM", ISSCC, Feb. 2014, 3 pages.
Y. Tsukamoto et. al, "1.8 Mbit/mm2 Ternary-CAM macro with 484 ps Search Access Time in 16 nm Fin-FET Bulk CMOS Technology" IEEE Symposium VLSI Circuits, 2015, abstract only.

(Continued)

*Primary Examiner* — Son Dinh
(74) *Attorney, Agent, or Firm* — Anthony Canale; Andrew M. Calderon; Roberts Mlotkowski Safran Cole & Calderon, P.C.

(57) ABSTRACT

The present disclosure relates to a pre-charge circuit including a first inverter which receives an early pre-charge signal and outputs an inverted early pre-charge signal, a first gate which receives a late pre-charge signal and a match line output signal and outputs an AND output signal, and a second gate which receives the inverted early pre-charge signal and the AND output signal and outputs an effective pre-charge signal.

20 Claims, 4 Drawing Sheets

(56) References Cited

OTHER PUBLICATIONS

I. Arsovski et al, "A 32 nm 0.58-fJ/Bit/Search 1-GHz Ternary Content Addressable Memory Compiler Using Silicon-Aware Early-Predict Late-Correct Sensing With Embedded Deep-Trench Capacitor Noise Mitigation" IEEE Journal of Solid-State Circuits, 2013, vol. 48, abstract only.

K. Nii et al., "A 28nm 400MHz 4-parallel 1.6Gsearch/s 80Mb ternary CAM", ISSCC, 2014, abstract only.

* cited by examiner

TERNARY CONTENT ADDRESSABLE MEMORY (TCAM) FOR MULTI BIT MISS DETECT CIRCUIT

FIELD OF THE INVENTION

The present disclosure relates to a ternary content addressable memory (TCAM) circuit, and more particularly, to a ternary content addressable memory (TCAM) for a multi bit miss detect circuit using a two phase pre-charge circuit.

BACKGROUND

Content Addressable Memory (CAM) is a special type of computer memory used in high-speed searching operations. A CAM is designed such that the user supplies a data word and the CAM searches its entire memory to see whether that data word is stored in the CAM. If the data word is found, the CAM returns a list of one or more storage addresses where the word was found.

A CAM is designed to search its entire memory in a single operation, which makes a CAM faster than Random Access Memory (RAM) in most search operations. However, in a CAM, each individual memory bit in a parallel CAM must have its own associated comparison circuit to detect a match between the stored bit and the input bit. Further, match outputs from each cell in the data word must be combined to yield a complete data word match signal.

Ternary Content Addressable Memory (TCAM) allows three matching states, which include 1, 0, and "X" (i.e., don't care) for one or more bits in the stored data word. TCAM executes a fully parallel search of the entire memory contents and uses a wild-card pattern matching to return search results in a single clock cycle. This capability makes TCAM attractive for implementing fast hardware look-up tables in network routers, processor caches, and many pattern recognition applications. However, the push for higher performance and memory density coupled with already high parallel activation creates noise challenges that could result in timing fails in both TCAM and its surrounding logic.

SUMMARY

In an aspect of the disclosure, a pre-charge circuit includes a first inverter which receives an early pre-charge signal and outputs an inverted early pre-charge signal, a first gate which receives a late pre-charge signal and a match line output signal and outputs an AND output signal, and a second gate which receives the inverted early pre-charge signal and the AND output signal and outputs an effective pre-charge signal.

In another aspect of the disclosure, a pre-charge circuit includes a first inverter which receives an early pre-charge signal and outputs an inverted early pre-charge signal, an AND gate which receives a late pre-charge signal and a match line output signal and outputs an AND output signal, an OR gate which receives the inverted early pre-charge signal and the AND output signal and outputs an effective pre-charge signal, and a PFET transistor with a source connected to a power supply and a gate connected to the effective pre-charge signal.

In another aspect of the disclosure, a method includes logically combining multiple phase pre-charge signals in conjunction with a match line output signal, and detecting multiple-bit mismatches within a ternary content addressable memory (TCAM) circuit in order to reduce a current consumption during a search operation.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to a ternary content addressable memory (TCAM) circuit, and more particularly, to a ternary content addressable memory (TCAM) for multi-bit miss detect circuit using a two phase pre-charge circuit. In embodiments, the present disclosure relates to a TCAM for multi-bit miss detect circuit which uses a two phase pre-charge (TPP) circuit to reduce overall power consumption.

In embodiments of the present disclosure, a two phase match line (ML) pre-charge circuit spends an initial amount of current during an early pre-charge phase to differentiate between likely matches and multi-bit mismatches. Then, the two phase match line (ML) pre-charge circuit disables the current sources to multi-bit mismatches during a late pre-charge phase to reduce the overall power consumption.

In embodiments of the present disclosure, a technique is implemented in a TCAM circuit which uses the two-phase match line (ML) pre-charge circuit. The two-phase ML pre-charge circuit cuts the current on easy to detect multi-bit mismatched match lines (MLs) early in the pre-charge cycle. Thus, the power of the match line is reduced.

Figure 1:
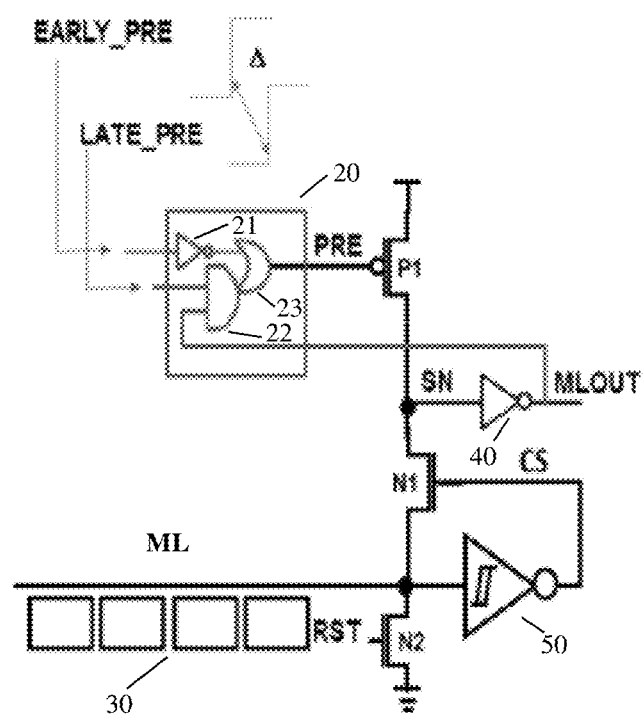
FIG. 1 shows a ternary content addressable memory (TCAM) for multi-bit miss detect circuit using a two phase pre-charge circuit in accordance with aspects of the present disclosure.

FIG. 1 shows a ternary content addressable memory (TCAM) for multi-bit miss detect circuit using a two phase pre-charge circuit in accordance with aspects of the present disclosure. In embodiments of the present disclosure, a TCAM circuit 10 includes a pre-charge circuit 20, a series of match devices 30, a transistor P1, a transistor N1, a transistor N2, an inverter 40, and an inverter 50. The transistor P1 is a PFET device and the transistors N1 and N2 are NFET devices. Further, in embodiments, the series of match devices 30 comprise a series of NFET devices.

In embodiments of the present disclosure, the pre-charge circuit 20 comprises an inverter 21, an AND gate 22, and an OR gate 23. In operation, the pre-charge circuit 20 receives an early pre-charge signal (i.e., EARLY_PRE) and a late pre-charge signal (i.e., LATE_PRE). Further, the EARLY_PRE signal goes high earlier in the pre-charge cycle than the LATE_PRE signal. In other words, in the pre-charge cycle, the EARLY_PRE signal goes high before the LATE_PRE signal goes high.

More specifically, in operation, the inverter 21 of the pre-charge circuit 20 receives an EARLY_PRE signal and outputs an inverted early pre-charge signal. The AND gate 22 receives a LATE_PRE signal and a match line output signal MLOUT and outputs an AND output signal. The OR gate 23 receives the inverted early pre-charge signal and the AND output signal and outputs the effective pre-charge signal PRE.

In embodiments of the present disclosure, the TCAM circuit 10 includes the transistor P1 with a source connected to a power supply and a gate connected to the effective pre-charge signal PRE. The TCAM circuit 10 also includes a transistor N1 with a drain connected to a drain of the transistor P1 and a gate connected to an output of the inverter 50. Further, the drain of transistor N1 is connected to a node SN. The TCAM circuit 10 further includes a transistor N2 with a drain connected to a source of the transistor N1, a gate connected to a reset signal RST, and a source connected to ground. The TCAM circuit 10 further includes the series of match devices 30 which are connected to the drain of transistor N2 and to the input of the inverter 50. Further, the inverter 40 is connected to a node SN between the transistor P1 and the transistor N1 and outputs the match line output signal MLOUT. The match devices 30 are NFET devices.

In embodiments of the present disclosure, the EARLY_PRE signal goes high in a first portion (i.e., early pre-charge portion of the pre-charge cycle) while the LATE_PRE signal stays low. Then, the LATE_PRE signal goes high in a second portion (i.e., late pre-charge portion of the pre-charge cycle) while the EARLY_PRE signal stays high. The first portion is before the second portion in the pre-charge cycle. If the match line output signal MLOUT is high when the LATE_PRE signal goes high, the transistor P1 is turned off and current does not flow through the transistor P1. The occurrence of a multi-bit miss is indicated when the match line output signal MLOUT is high at the time that the LATE_PRE signal goes high.

In operation, as represented in FIG. 1, the EARLY_PRE signal may go high while the LATE_PRE signal is low. Current is then drawn through transistor P1 and transistor T1, which charges the match line ML. Then, the LATE_PRE signal goes high after a predetermined time after the EARLY_PRE signal goes high. At this point, both EARLY_PRE signal and LATE_PRE signal are high. If both EARLY_PRE signal and LATE_PRE signal are high, the TCAM circuit 20 will search the data for a match. If there is a match, then there is no conduction between the match line ML and the match devices 30. Therefore, in this scenario, current flows through the inverter 50 such that the output of the inverter 50 is low and turns off transistor N1. On the other hand, if there is a mismatch, there is conduction between the match line ML and the match devices 30.

In current systems, a TCAM circuit activates every search line (SL) and every match line (ML) in an array, creating a current demand that is significantly larger than that of a similarly-sized static random access memory (SRAM). Further, when there are a lot of mismatches in the TCAM circuit, current is drawn during the pre-charge cycle and hence power is consumed. In known circuitry, the current and power will always be drawn for each mismatch during the full pre-charge cycle, which could draw a large amount of current and overall power in the pre-charge cycle. In contrast, in the present disclosure, when the LATE_PRE signal goes high and the match line output signal MLOUT is high (indicating a multi-bit miss), transistor P1 is shut off earlier in the pre-charge cycle, thereby significantly reducing the pre-charge current consumption during multi-bit misses. Hence, in embodiments, overall power may be reduced by approximately 60% in the pre-charge cycle when the transistor P1 is shut down. The two phase pre-charge circuit 20 comprises an EARLY_PRE signal, a LATE_PRE signal, and the MLOUT signal which provides a method to detect multi-bit misses earlier in the pre-charge cycle than that of known pre-charge systems and methods.

In embodiments of the present disclosure, the early pre-charge cycle is used to detect large mismatches (e.g., more than 8-bit mismatches). Then, the late pre-charge cycle spends additional current to further differentiate between no mismatches and one-bit mismatches. The pre-charge circuit 20 starts the phase-one of the match line pre-charge with the EARLY_PRE signal which causes the effective pre-charge signal PRE to go low, thereby allowing pre-charge current to flow through transistors P1, N1 and starting to charge the match line. The match line with no mismatches or only a few bit mismatches charges up quickly, causing the match line output signal MLOUT to fall shortly after EARLY_PRE signal is asserted. In contrast, the match line with many mismatches will charge up more slowly, which will prevent or delay the fall of the match line output signal MLOUT. Therefore, if the match line output signal MLOUT is still high when the LATE_PRE signal goes high to start the second phase of the pre-charge cycle, then the pre-charge circuit 20 will cause the effective pre-charge signal PRE to rise, which will stop the pre-charge current. Each sense amplifier makes its own decision whether to continue to supply current to the likely match line or cut the current and save power on the corresponding match line. Match lines whose match line output signal MLOUT is low continue to receive the current, while match lines whose match line output signal MLOUT is high stop pre-charging to save current and power output. The delay between the EARLY_PRE signal and the LATE_PRE signal is determined by a replica-bias generated match delay circuit.

Moreover, after the two-phase pre-charge phase completes in the pre-charge circuit 20, the match lines are left floating, which allow the corresponding mismatched match lines to discharge and trigger a miss and the corresponding matched match lines pre-charged high to result in a hit. Further, a latch signal (not shown) is used to separate between these two cases. The pre-charge circuit 20 is part of the sense amplifier (SA) for the TCAM circuit 10.

In embodiments of the present disclosure, the pre-charge circuit 20 includes a two phase pre-charge (TPP) circuit. However, in an alternative embodiment, the pre-charge circuit 20 can include multiple phases (i.e., N phases) of a pre-charge circuit. In the alternative embodiment, the pre-charge circuit 20 with multiple N phases (i.e., N greater than 2) disables multiple pre-charge signals depending on the number of mismatches. For example, after a first pre-charge signal goes high, a second pre-charge signal can go high when there are greater than 50% mismatches, a third pre-charge signal can go high when there are greater than 25% mismatches, a fourth pre-charge signal can go high when there are greater than 10% mismatches, etc. Thus, in the alternative embodiment, the pre-charge circuit 20 can include multiple phases of a pre-charge circuit in order to cut off current and power output at a lower amount of mismatched bits.

Figure 2:
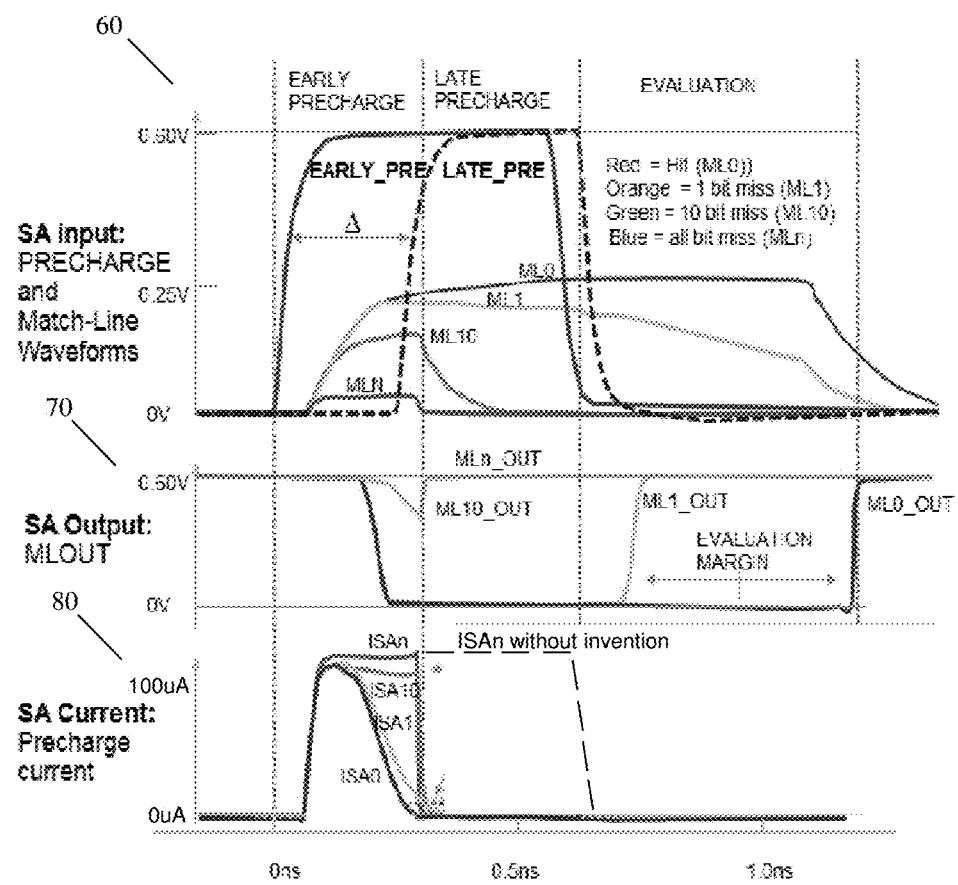
FIG. 2 shows graphs of input, output, and current of the TCAM for multi-bit miss detect circuit in accordance with aspects of the present disclosure.

FIG. 2 shows graphs of input, output, and current of the TCAM for a multi-bit miss detect circuit in accordance with aspects of the present disclosure. In FIG. 2, the y-axis represents a voltage and the x-axis represents time in nanoseconds. Further, in the plot 60, the EARLY_PRE signal goes high in the early pre-charge portion of the pre-charge cycle while the LATE_PRE signal is still low. Then, at the late pre-charge portion of the pre-charge cycle, the LATE_PRE signal goes high while the EARLY_PRE signal stays high. Further, in the plot 60, ML0 represents a match line graph where there are no mismatches (all matches). ML1 represents a match line graph where the there is a one bit miss (i.e., 1 bit mismatch), ML10 represents a match line graph where there is a 10 bit miss (i.e., 10 bit mismatch), and MLn represents a mach line graph where all bits are missed (e.g., all bits are mismatched).

In embodiments of the present disclosure, an EARLY_PRE signal may be asserted to a high level in the pre-charge circuit 20 while a LATE_PRE signal may be at a low level. Further, the LATE_PRE signal may be asserted to a high level in the pre-charge circuit 20 after the EARLY_PRE signal is asserted to the high level. Further, the transistor P1 may be turned off in the TCAM circuit 10 in response to the match line output signal (e.g., MLOUT) being high and the LATE_PRE signal being asserted to the high level. Thus, current flow is prevented through the transistor P1 in response to the P1 transistor being turned off.

In FIG. 2, in the plot 70, the match line output signal MLOUT for the corresponding signals ML0, ML1, ML10, and MLn are ML0_OUT, ML1_OUT, ML10_OUT, and MLn_OUT. As shown in the plot 70, ML0_OUT and ML1_OUT go low shortly after the EARLY_PRE signal is asserted pre-charge while ML10_OUT and MLn_OUT are high during both the early pre-charge portion and the late pre-charge portion of the pre-charge cycle. ML10_OUT slightly dips in voltage at the end of the early pre-charge cycle, but remains high enough (in conjunction with LATE_PRE going high) to trip the AND gate of circuit 20 to cause the effective pre-charge signal PRE to go high which shuts off P1, thereby reducing the current consumption during the pre-charge cycle. Also, in FIG. 2, plot 80 shows the current drawn during the pre-charge cycle by the match line sense amp (SA) for various number of mismatch conditions. ISA0 is the current drawn when there are no bit mismatches, ISA1 is the current drawn when there is a one bit mismatch, ISA10 is the current drawn when there are 10 bit mismatches and ISAn is the current drawn when all bits mismatch. In particular, as the late pre-charge portion of the pre-charge cycle starts, pre-charge circuit 20 detects the occurrence of a multi-bit miss condition and shuts off P1, thereby reducing the current for ISAn and ISA10. In contrast to the present disclosure, the dotted line of ISAn shows the pre-charge current drawn by ISAn in a known system which doesn't include the pre-charge circuit 20 and the two phase pre-charge scheme. Therefore, the present disclosure saves approximately 60% of the pre-charge power consumption. When the number of mismatch bits is zero or low, the match line (and the SN node) pre-charges quickly, which causes inverter 50 to lower the CS signal and shuts off transistor N1. Therefore, for low mismatch conditions, the pre-charge current has already been completed by the time LATE_PRE is asserted high.

Figure 3:
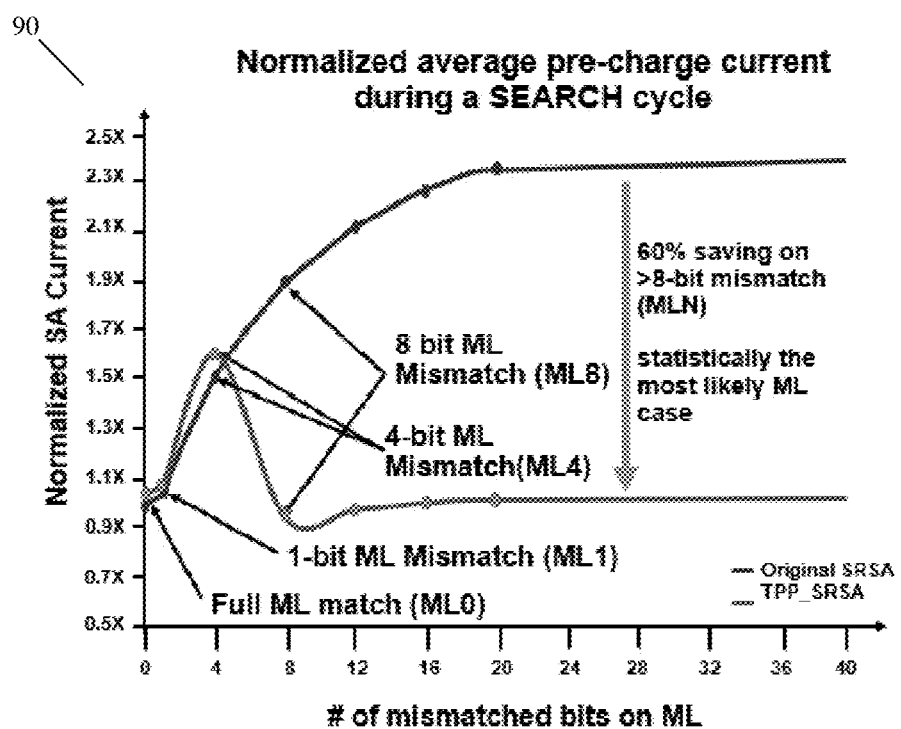
FIG. 3 shows a graph of a normalized average pre-charge current during a search cycle in accordance with aspects of the present disclosure.

FIG. 3 shows a graph of a normalized average pre-charge current during a search cycle in accordance with aspects of the present disclosure. In FIG. 3, the original self-referenced ML sense amplifier (SRSA) is a known system in which there is only one pre-charge signal. In contrast, the two-phase pre-charge SRSA (TPP SRSA) of the present disclosure has both an EARLY-PRE signal and a LATE_PRE signal. In FIG. 3, in the plot 90, the y axis shows the normalized sense amplifier (SA) current and the x axis shows the number of mismatched bits on the match line (ML).

In FIG. 3, when comparing a full match line match ML0 (i.e., no mismatches), there is not much difference in normalized SA current between the original SRSA and the TPP SRSA (i.e., both are approximately at 1.0×). Further, when comparing a 1-bit mismatch ML1, there is not much difference in normalized SA current between the original SRSA and the TPP SRSA (i.e., both are approximately at 1.1×). When comparing a 4-bit mismatch ML4, there is a slight difference in normalized SA current between the original SRSA and the TPP SRSA (i.e., approximately 1.6× for TPP SRSA and approximately 1.5× for original SRSA).

In FIG. 3, when comparing a 8-bit mismatch ML8, there is a large difference in normalized SA current between the original SRSA and the TPP SRSA (i.e., approximately 1.9× for original SRSA and approximately 1.0× for TPP SRSA). Further, when the mismatches are greater than 8 bits MLn, there is a very large difference in normalized SA current between the original SRSA and the TPP SRSA (i.e., approximately 2.3× for original SRSA and approximately 1.0× for TPP SRSA). Based on empirical evidence, the situation in which there are more than 8-bit mismatches is the most likely scenario. Thus, in this situation (i.e., MLn), the circuitry described herein can produce a 60% saving in normalized SA current.

Figure 4:
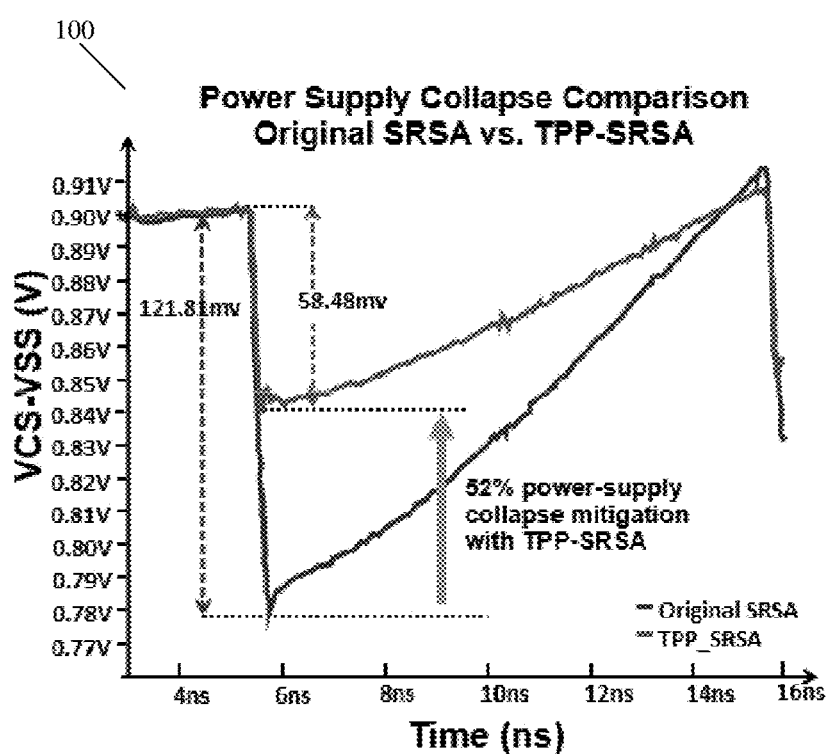
FIG. 4 shows a graph of a comparison between a known sense amplifier and a two phase pre-charge sense amplifier in accordance with additional aspects of the present disclosure.

FIG. 4 shows a graph of a comparison between a known sense amplifier and a two phase pre-charge sense amplifier in accordance with aspects of the present disclosure. In FIG. 4, in the plot 100, the y axis shows the power supply voltage VCS-VSS in volts and the x axis shows the time in nanoseconds. In the plot 100, and similar to FIG. 3, the original self-referenced ML sense amplifier (SRSA) is a known system in which there is only one pre-charge signal and the two-phase pre-charge SRSA (TPP SRSA) comprises the claimed invention in which there is both an EARLY_PRE signal and a LATE_PRE signal.

In FIG. 4, the original SRSA power supply voltage starts at 0.9 volts, and drops to 0.78 volts before 6 nanoseconds, e.g., before the power supply voltage ramps up to 0.9 volts again at about 15 nanoseconds. In contrast, the TPP SRSA power supply starts at 0.9 volts, and drops to 0.84 volts right before 6 nanoseconds, e.g., before the power supply voltage ramps up to 0.9 volts again at about 15 nanoseconds.

As shown in FIG. 4, there is a 121.8 mV difference between power supply voltage values of the original SRSA between 4 to 6 nanoseconds. Further, there is a 54.48 mV difference between power supply voltage values of TPP SRSA between 6 to 8 nanoseconds. Therefore, in TPP SRSA, there is approximately a 52% power-supply collapse mitigation (as indicated by the arrow).

The ternary content addressable memory (TCAM) for multi-bit miss detect circuit of the present disclosure can be manufactured in a number of ways using a number of different tools. In general, though, the methodologies and tools are used to form structures with dimensions in the micrometer and nanometer scale. The methodologies, i.e., technologies, employed to manufacture the ternary content addressable memory (TCAM) for multi-bit miss detect circuit of the present disclosure have been adopted from integrated circuit (IC) technology. For example, the structures are built on wafers and are realized in films of material patterned by photolithographic processes on the top of a wafer. In particular, the fabrication of the ternary content addressable memory (TCAM) for multi-bit miss detect circuit uses three basic building blocks: (i) deposition of thin films of material on a substrate, (ii) applying a patterned mask on top of the films by photolithographic imaging, and (iii) etching the films selectively to the mask.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A pre-charge circuit, comprising:
a first inverter which receives an early pre-charge signal and outputs an inverted early pre-charge signal;
a first gate which receives a late pre-charge signal and a match line output signal and outputs an AND output signal; and
a second gate which receives the inverted early pre-charge signal and the AND output signal and outputs an effective pre-charge signal.

2. The pre-charge circuit of claim 1, further comprising:
a PFET transistor with a source connected to a power supply and a gate connected to the effective pre-charge signal;
a first NFET transistor with a drain connected to a drain of the PFET transistor and a gate connected to an output of a second inverter; and
a second NFET transistor with a drain connected to a source of the first NFET transistor, a gate connected to a reset signal, and a source connected to ground.

3. The pre-charge circuit of claim 2, further comprising:
a plurality of match devices which are connected to the drain of the second NFET transistor and to the input of the second inverter; and
a third inverter with its input connected to a node between the PFET transistor and the first NFET transistor and outputs the match line output signal.

4. The pre-charge circuit of claim 3, wherein each of the plurality of match devices are NFET devices.

5. The pre-charge circuit of claim 1, wherein the early pre-charge signal goes high in a first portion of a pre-charge cycle while the late pre-charge signal stays low.

6. The pre-charge circuit of claim 5, wherein the late pre-charge signal goes high in a second portion of the pre-charge cycle while the early pre-charge signal stays high.

7. The pre-charge circuit of claim 6, wherein the first portion of the pre-charge cycle is before the second portion of the pre-charge cycle.

8. The pre-charge circuit of claim 6, wherein if the match line output signal is high when the late pre-charge signal goes high, the PFET transistor is turned off and current does not flow through the PFET transistor.

9. The pre-charge circuit of claim 8, wherein a multi-bit miss occurs when the match line output signal is high and the late pre-charge signal goes high.

10. The pre-charge circuit of claim 1, wherein the pre-charge circuit is in a sense amplifier (SA) for a ternary content addressable memory (TCAM).

11. A pre-charge circuit, comprising:
a first inverter which receives an early pre-charge signal and outputs an inverted early pre-charge signal;
an AND gate which receives a late pre-charge signal and a match line output signal and outputs an AND output signal;
an OR gate which receives the inverted early pre-charge signal and the AND output signal and outputs an effective pre-charge signal; and
a PFET transistor with a source connected to a power supply and a gate connected to the effective pre-charge signal.

12. The pre-charge circuit of claim 11, further comprising:
a first NFET transistor with a drain connected to a drain of the PFET transistor and a gate connected to an output of a second inverter; and
a second NFET transistor with a drain connected to a source of the first NFET transistor, a gate connected to a reset signal, and a source connected to ground.

13. The pre-charge circuit of claim 12, further comprising:
a plurality of match devices which are connected to the drain of the second NFET transistor and to the input of the second inverter; and
a third inverter which is connected to a node between the PFET transistor and the first NFET transistor and outputs the match line output signal,
wherein each of the plurality of match devices are NFET devices.

14. The pre-charge circuit of claim 11, wherein the early pre-charge signal goes high in a first portion of a pre-charge cycle while the late pre-charge signal stays low.

15. The pre-charge circuit of claim 14, wherein the late pre-charge signal goes high in a second portion of the pre-charge cycle while the early pre-charge signal stays high.

16. The pre-charge circuit of claim 15, wherein if the match line output signal is high when the late pre-charge signal goes high, the PFET transistor is turned off and current does not flow through the PFET transistor.

17. The pre-charge circuit of claim 16, wherein a multi-bit miss occurs when the match line output signal is high and the late pre-charge signal goes high.

18. A method, comprising:
asserting an early pre-charge signal of multiple phase pre-charge signals to a high level in a ternary content addressable memory (TCAM) circuit while a later pre-charge signal of the multiple phase pre-charge signals is at a low level;

asserting the late pre-charge signal of the multiple phase pre-charge signals to a high level in the TCAM circuit after the early pre-charge signal is asserted to the high level;

logically combining the multiple phase pre-charge signals in conjunction with a match line output signal; and detecting multiple-bit mismatches within the TCAM circuit in order to reduce a current consumption during a search operation.

19. The method of claim 18, wherein the multiple-bit mismatches are detected when the match line output signal is high and the late pre-charge signal is asserted to the high level.

20. The method of claim 19, further comprising:

turning off a PFET transistor in the TCAM circuit in response to the match line output signal being high and the late pre-charge signal being asserted to the high level; and preventing current flow through the PFET transistor in response to the PFET transistor being turned off.

* * * * *